United States Patent
Horn

(10) Patent No.: US 6,480,038 B1
(45) Date of Patent: Nov. 12, 2002

(54) BIPOLAR COMPARATOR

(75) Inventor: Wolfgang Horn, Villach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/012,178

(22) Filed: Oct. 29, 2001

(30) Foreign Application Priority Data

Oct. 27, 2000 (DE) ......................................... 100 53 374

(51) Int. Cl.[7] ................................................. H03K 5/22
(52) U.S. Cl. ........................................... 327/66; 327/53
(58) Field of Search ............................ 327/63, 65–67, 327/77, 78, 50, 51, 52, 53, 55, 56, 57, 54, 103, 478; 323/315

(56) References Cited

U.S. PATENT DOCUMENTS

| | | | |
|---|---|---|---|
| 4,529,893 A | | 7/1985 | Nagano ..................... 307/361 |
| 5,132,576 A | * | 7/1992 | Park ............................ 327/51 |
| 5,856,748 A | * | 1/1999 | Seo et al. ..................... 327/52 |
| 5,874,840 A | * | 2/1999 | Bonaccio .................... 327/51 |
| 6,091,226 A | * | 7/2000 | Amano ........................ 327/77 |

FOREIGN PATENT DOCUMENTS

| | | |
|---|---|---|
| DE | 42 10 215 C2 | 12/1992 |
| EP | 0 736 975 A1 | 10/1996 |

* cited by examiner

Primary Examiner—Toan Tran
(74) Attorney, Agent, or Firm—Laurence A. Greenberg; Werner H. Stemer; Ralph E. Locher

(57) ABSTRACT

A bipolar comparator with an asymmetric differential amplifier stage is described. The comparator has two transistors, and the control electrodes of which are short circuited to one another. The two transistors have load paths that are connected in series in each case with one current source between one input terminal and a supply terminal. An output terminal is connected to the second current source and to a load electrode of the second transistor, at which output terminal an output signal can be picked up. A third transistor is provided with a load path disposed in parallel with the load path of the first transistor. The first current source generates a first operating current being a multiple of the second operating current generated by the second current source and the multiple corresponds to an effective area ratio of the first and third transistor with respect to the second transistor.

12 Claims, 5 Drawing Sheets

BIPOLAR COMPARATOR

BACKGROUND OF THE INVENTION

Field of the Invention

The invention relates to a bipolar comparator containing an asymmetric differential amplifier stage.

Comparators are circuit configurations, which have been generally known for a long time so only the basic configuration and the operation of such a comparator will be discussed in the text, which follows.

Comparators are generally used for detecting a voltage referred to as a reference potential. As soon as the voltage to be detected exceeds a predetermined value, the so-called threshold value, a signal can be picked up at the output of the comparator, which indicates that the threshold value, which for example, can be the reference voltage, is exceeded. If, in contrast, the threshold value is not reached by the input voltage at the comparator, the output of the comparator outputs an output signal which also unambiguously signals a falling short of the threshold value. In the case of a comparator having an asymmetric output, two inputs and a single output are provided. At the output terminal, two different voltage levels can be picked up depending on whether the input voltage applied to the input terminals is greater than or less than the reference voltage.

A standard version of a bipolar comparator exhibits a differential amplifier at its input, which has two bipolar transistors, the load paths of which are connected to input terminals for applying an input voltage at an emitter end. The comparator typically has an offset $\Delta Vbe$, Vbe being a voltage between a base and an emitter of the bipolar differential amplifier transistors.

The problem with such bipolar comparator circuits is the fact that at the collector terminals, leakage currents flow, which can change an amount of an offset $\Delta Vbe$ in an undefined manner. The offset $\Delta Vbe$ caused by the leakage currents is changed in a defined manner even if the leakage currents occurring in the two bipolar transistors are identical per unit area of the collector, that is to say there is optimum matching. However, the change in offset leads to a more or less great impairment of the accuracy of the comparator and can result in an operational failure of the comparator in the extreme case.

In conventional comparator configurations, therefore, it is attempted to avoid the leakage currents at the collectors as much as possible or at least to reduce them, as a result of which, naturally, a compromise must be made in accuracy and thus also in operability of the comparator configuration. It is particularly in the case of very high temperatures, for example within a range of more than 150° C. and/or a not inconsiderable injection of minority charge carriers into the semiconductor substrate, also called reverse current in the case of power semiconductors, that avoiding the leakage current is possible only to a certain extent or not at all. For this reason, it has hitherto been possible to use conventional bipolar comparator configurations based on avoiding leakage currents only to a restricted extent under the conditions described. However, there is a requirement to use existing comparator configurations even at higher operating temperatures and minority charge carrier injections.

SUMMARY OF THE INVENTION

It is accordingly an object of the invention to provide a bipolar comparator which overcomes the above-mentioned disadvantages of the prior art devices of this general type, which remains largely unaffected in its operability and accuracy even with high collector leakage currents.

With the foregoing and other objects in view there is provided, in accordance with the invention, a bipolar comparator with an asymmetric differential amplifier stage.

The comparator contains current sources including a first current source and a second current source each having an output and input terminals including a first input terminal for receiving a first input potential and a second input terminal for receiving a second input potential. Transistors, including a first transistor and a second transistor each having a control electrode short-circuited to one another, a load electrode, and a load path, are provided. The load path of the first transistor is disposed in series between the first current source and the first input terminal. The load path of the second transistor is disposed in series between the second current source and the second input terminal. A supply terminal for receiving a supply potential is connected to the current sources. An output terminal is connected between the second current source and the load electrode of the second transistor. An output signal is available for picked up at the output terminal. A third transistor is provided and has a load path disposed in parallel with the load path of the first transistor. The first transistor is connected as a diode resulting in a diode-connected first transistor. The first current source generates a first operating current being a multiple of a second operating current generated by the second current source and the multiple corresponds to an effective area ratio of the first and the third transistor with respect to the second transistor.

By connecting the additional transistor in parallel with a transistor of the differential amplifier stage and by a suitable choice of area ratios and of the currents, it becomes possible for the influence of the collector leakage currents on the accuracy of the offset voltage to be eliminated. The offset voltage is then largely leakage-current-independent over wide ranges of the operating current even with increasing temperature and has a defined temperature dependence that can be compensated for, for example, by a shunt resistor or similar circuit device. The essential prerequisite for this is, however, very good matching of the two transistors of the differential amplifier stage and of the additional transistor. The transistor added additionally which is also called a dummy transistor in the text which follows is thus only used for eliminating the leakage-current-dependence of the offset voltage. However, the dummy transistor has no influence whatever on the actual operation of the comparator.

It is essential for the operation of the comparator configuration according to the invention that the sum of effective or normalized collector areas of the diode-connected transistor and of the dummy transistor connected in parallel therewith is a multiple of the effective or normalized collector area of the respective other transistor of the differential amplifier stage. By effective (or normalized) collector area, the (normalized) boundary area between the collector and substrate is meant. The multiple also corresponds to the ratio of the operating currents of the two current sources. As already mentioned, the ratio of the currents provided by the two current sources should very precisely correspond to the effective collector area ratios. The effective collector area ratios are obtained from the corresponding area ratios of the first transistor and the dummy transistor divided by the collector area of the second transistor.

In a very advantageous embodiment of the invention, a correction circuit is provided which essentially contains two current balancing circuits. The outputs of the current balancing circuits are connected to in each case one of the current sources so that a correction current can be superimposed on the operating current generated by the respective current sources. In the case where at least one leakage current exceeds the operating current of the respective current source, it is just this operating current on which a correction current is superimposed in such a manner that the sum of the currents is greater in every case than the corresponding leakage current. This makes it possible to ensure that the current through the load path of the differential amplifier transistors is greater in every case than the corresponding leakage current. Thus, no unwanted and abrupt rise in offset voltage can occur. By the correction circuit, the operating current supplied to the two transistors of the differential amplifier stage can be dynamically adapted.

In a particularly advantageous embodiment, the two current balancing circuits of the correction circuit have in each case a single common input branch. In the input branch, a measuring transistor is advantageously disposed which measures the respective leakage current of the comparator configuration. The measuring transistor is only used as a sensor and typically does not need to match the area ratios of the transistors of the differential amplifier stage and of the dummy transistor.

In an advantageous embodiment, the measuring transistor has a greater collector area than the transistors of the differential amplifier stage. This ensures that the leakage current of the measuring transistor is always greater than the corresponding leakage current of the differential amplifier transistors and of the dummy transistor.

The current sources of the comparator are advantageously constructed as ideal current sources. Typically, however, the current sources are constructed as field-effect-controlled transistors, particularly as MOSFETs. As an alternative, an embodiment of the current sources as resistors would also be conceivable.

The differential input signal, which is coupled into the input terminals can be picked up in a very simple manner, for example, across a shunt resistor connected to an input terminal. The other input terminal in each case could then be connected, for example, to the potential of a reference ground.

The transistors of the differential amplifier stage and/or of the dummy transistor and/or of the measuring transistor are typically constructed as bipolar transistors. The transistors of the correction circuit and/or of the current sources could also be implemented in a bipolar manner. However, any other embodiment of these elements would also be conceivable. The transistors of the current balancing configurations, for example, can be constructed as MOSFETs equivalent to the transistors of the current sources. However, the current source transistors and the transistors of the current balancing configurations can also be constructed in another manner, for example by junction FET transistors, thyristors, IGBTs or the like.

In one embodiment, the first transistor and/or the second transistor of the differential amplifier stage are integrated in a semiconductor body, the transistors are implemented by connecting the load paths of a multiplicity of first and second single transistors in parallel. The best possible matching of the two transistors of the differential amplifier stage can be achieved in this case, for example, by so-called crossing out of the transistors in the layout. By crossing out it is meant that the respective transistors have the same center point or center of gravity in the layout. It is particularly in the implementation of the transistors via a parallel connection of a multiplicity of single-transistors that this can be achieved in that the center point of the individual transistors, which form the first and third transistor coincides with the center point of the individual transistors for the second transistor.

It is particularly advantageous if the multiple or, respectively, the area ratio of the first and third transistor with respect to the second transistor is equal or approximately equal to two. With n=2 and at room temperature, the offset is about 18 mV. In the case of a square, rectangular, strip-shaped or similar layout of the transistor areas, the three transistors—i.e. the transistors of the differential amplifier stage and the dummy transistor—can be disposed here in a very simple manner next to one another, the second transistor being disposed between the other two. The first and third transistor thus indicate the center point of the second transistor in this case. Transistors with round, oval, hexagonal, triangular layouts would also be conceivable. In this case, the correspondingly best-suited transistor layouts could be selected according to the desired offset.

In accordance with an added feature of the invention, the effective area ratio is equal to a sum of effective collector areas of the first and the third transistor divided by an effective collector area of the second transistor.

In accordance with an additional feature of the invention, a correction circuit is provided and has a first output connected to the output of the first current source and a second output connected to the output of the second current source. In a case where a leakage current at one of the first and the second transistor exceeds the first operating current or the second operating current, respectively, the correction circuit dynamically superimposes a-correction current on one of the first and the second operating current in such a manner that a resultant current is greater than the leakage current.

In accordance with another feature of the invention, the correction circuit has two current balancing circuits including a first current balancing circuit and a second current balancing circuit. The two current balancing circuits have a common input branch and in each case one output branch.

A transmission ratio of the first current balancing circuit is inversely proportional to the effective collector area of the first and of the third transistor. A transmission ratio of the second current balancing circuit is inversely proportional to the effective collector area of the second transistor.

In accordance with a further feature of the invention, the correction circuit has a measuring transistor with a load current path disposed in the common input branch of the two current balancing circuits.

In accordance with a further added feature of the invention, the measuring transistor has an effective collector area that is greater than the effective collector area of the first transistor, the effective collector area of the second transistor, and/or the effective collector area of the third transistor.

In accordance with a further additional feature of the invention, at least one of the current sources is constructed from a transistor, including MOSFETs. Alternatively, at least one of the current sources is constructed as a resistor.

In accordance with another feature of the invention, a shunt resistor is connected to the second input terminal and across which an input voltage can be picked off.

In another alternative of the invention, a semiconductor body is provided and the first transistor, the second transistor, and/or the third transistor is integrated in the semiconductor body. Each of the first, the second and the third transistor is formed of three individual transistors having load current paths connected in parallel with each other. The three individual transistors include a first individual transistor, a second individual transistor and a third individual transistor. The first and the third individual transistor of the first and the third transistor and the second individual transistor of the second transistor are disposed in such a manner that a center point resulting from the first and the third individual transistor is equal to a center point of the at second individual transistor in a layout of the semiconductor body.

In accordance with a concomitant feature of the invention, the multiple is two.

Other features which are considered as characteristic for the invention are set forth in the appended claims.

Although the invention is illustrated and described herein as embodied in a bipolar comparator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
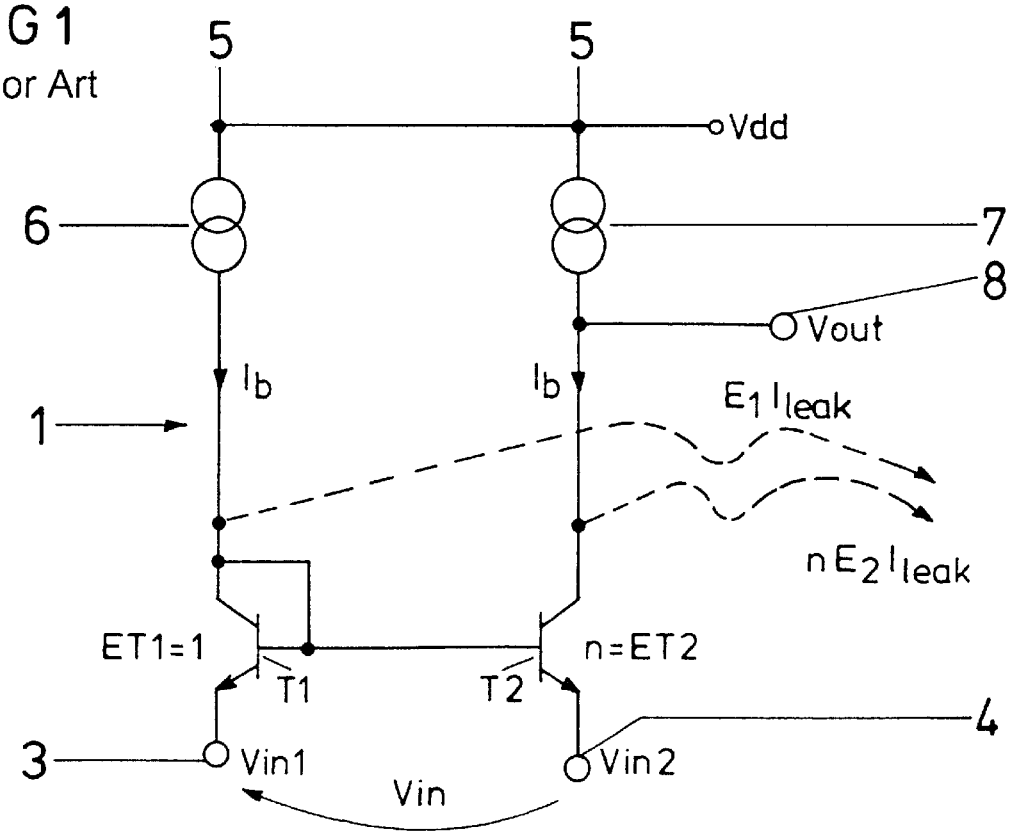
FIG. 1 is a circuit diagram of a bipolar comparator according to the prior art.

In all the figures of the drawing, sub-features and integral parts that correspond to one another bear the same reference symbol in each case. Referring now to the figures of the drawing in detail and first, particularly, to FIG. 1 thereof, there is shown a circuit diagram of a known asymmetric comparator of bipolar construction. In FIG. 1, 1 designates a differential amplifier stage of the comparator. The differential amplifier stage 1 has two bipolar transistors T1, T2 which are short circuited to one another via their base electrodes. The two transistors T1, T2 are in each case disposed between an input terminal 3, 4 and a supply terminal 5 via their load paths, that is to say via their collector-emitter paths. In each case, an input potential Vin1, Vin2 is present at the input terminals 3, 4 so that an input voltage Vin can be applied to the differential amplifier stage 1 via the input terminals 3, 4. A supply potential Vdd is present at the supply terminal 5. The two transistors T1, T2 thus form an amplifier stage.

A current source 6, 7 which provides an operating current Ib is in each case connected in series between collector electrodes of the transistors T1, T2 and the supply terminal 5. The first transistor t1 which is diode-connected has a normalized collector area ET1=1. The second bipolar transistor T2 has a normalized collector area ET2=n. A tap between the second current source 7 and the second transistor T2 is connected to an output terminal 8 of the differential amplifier stage 1 at which an output potential Vout can be picked up. The output terminal 8 thus forms a current output, which acts in opposition to the current source 7. The comparator configuration typically acts as a voltage-controlled current source, which provides a single current signal at its output 8 when a differential input signal is coupled in.

FIG. 1 thus shows a general embodiment of the bipolar asymmetric comparator with an offset $\Delta Vbe$, $\Delta Vbe$ being an offset of the input voltage at a switching point. It is advantageously possible to set the offset $\Delta Vbe$ here via the ratio of the collector areas ET1, ET2 and the currents Ib without needing a reference voltage for this purpose.

In the case of non-ideal transistors T1, T2 of the differential amplifier stage 1, leakage currents $I_{leak}$ typically occur which change the amount of the offset $\Delta Vbe$ in an undefined manner even if the leakage currents $I_{leak}$ per unit area ET1, ET2 of the collector are identical in both transistors T1, T2. This is called optimum matching. Optimum matching occurs when the efficiency or current gain E1, E2 of a parasitic bipolar transistor is the same in both transistors T1, T2, that is to say if:

$$E1=E2 \qquad (1)$$

When a bipolar transistor is integrated in a semiconductor body, an unwanted lateral bipolar transistor is frequently produced by leakage currents laterally penetrating into the semiconductor body. As already mentioned initially, the leakage currents are due to thermal conditions and/or are generated by injection of charge carriers into the substrate.

The offset $\Delta Vbe$ is then obtained as follows:

$$\Delta Vbe = \frac{kT}{q}\ln\frac{Ib - E1 I_{leak}}{\frac{1}{n}{Ib - nE2 I_{leak}}} \qquad (2)$$

where k is the Bolzmann constant, T is the temperature and q is an elementary charge. In the case of optimum matching, that is to say in the case of E1=E2, the following holds true:

$$\Delta Vbe = \frac{kT}{q}\ln\frac{n(Ib - E1 I_{leak})}{Ib - nE2 I_{leak}} \neq \frac{kT}{q}\ln n \qquad (3)$$

Equation (3) shows that the offset $\Delta Vbe$ is dependent on the leakage current even with optimum matching. The change in the offset $\Delta Vbe$, especially at high temperatures or due to parasitic components, leads to a severe impairment of the accuracy and can lead to an operating failure of the comparator configuration in the extreme case.

Figure 2:
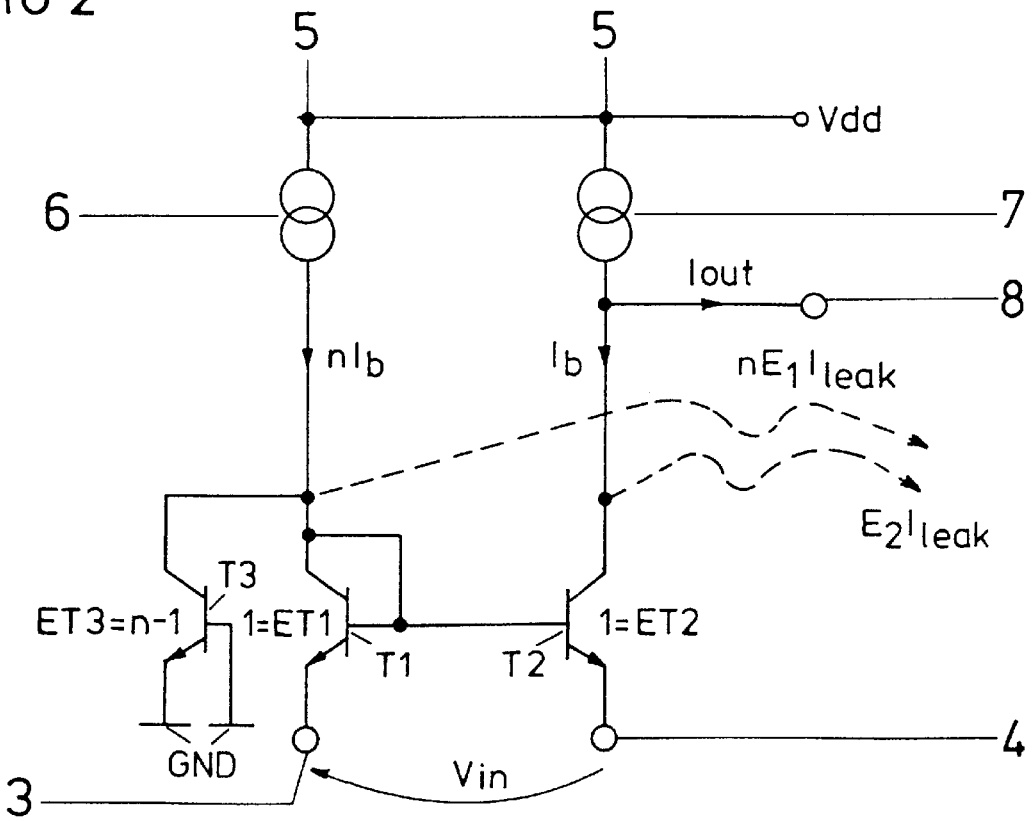
FIG. 2 is a circuit diagram of a first exemplary embodiment of the bipolar comparator according to the invention.

FIG. 2 shows a comparator according to the invention, which has an additional transistor T3 compared with the prior art comparator shown in FIG. 1. A load current path of the third transistor T3 is disposed between a load output of the first transistor and a reference potential GND so that the collector electrodes of the two transistors T1, T3 are short-circuited to one another. A base electrode of the third transistor is also connected to the reference potential GND. The first current source 6 supplies n times the operating current Ib of the second current source 7. The first and second transistor T1, T2 in each case have a normalized collector area ET1=ET2=1 whereas the third, so-called dummy transistor T3 has a normalized collector area ET3= n−1. A sum of the collector areas of the first and third transistor T1, T3 is thus ET1+ET3=n. With a current ratio n, the following relation is thus obtained for the offset ΔVbe:

$$\Delta Vbe = \frac{kT}{q}\ln\frac{\frac{nIb - nE1I_{leak}}{1}}{\frac{Ib - E2I_{leak}}{1}} = \frac{kT}{q}\ln n \quad (4)$$

Equation (4) shows that the influence of the leakage currents on the accuracy of the offset voltage ΔVbe is eliminated by inserting the dummy transistor T3 and by suitably changing the collector areas of the transistors T1, T2, T3. The offset ΔVbe can thus be adjusted in a defined manner. The prerequisite for this is again good matching, that is to say E1=E2. This can be achieved, for example, by the center point of the two transistors T1, T3 in the layout of the circuit configuration coinciding with the center point of the transistor T2 and/or suitably choosing the corresponding emitter areas.

The leakage currents are in each case indicated by dashed arrows in FIGS. 1 and 2.

Figure 3:
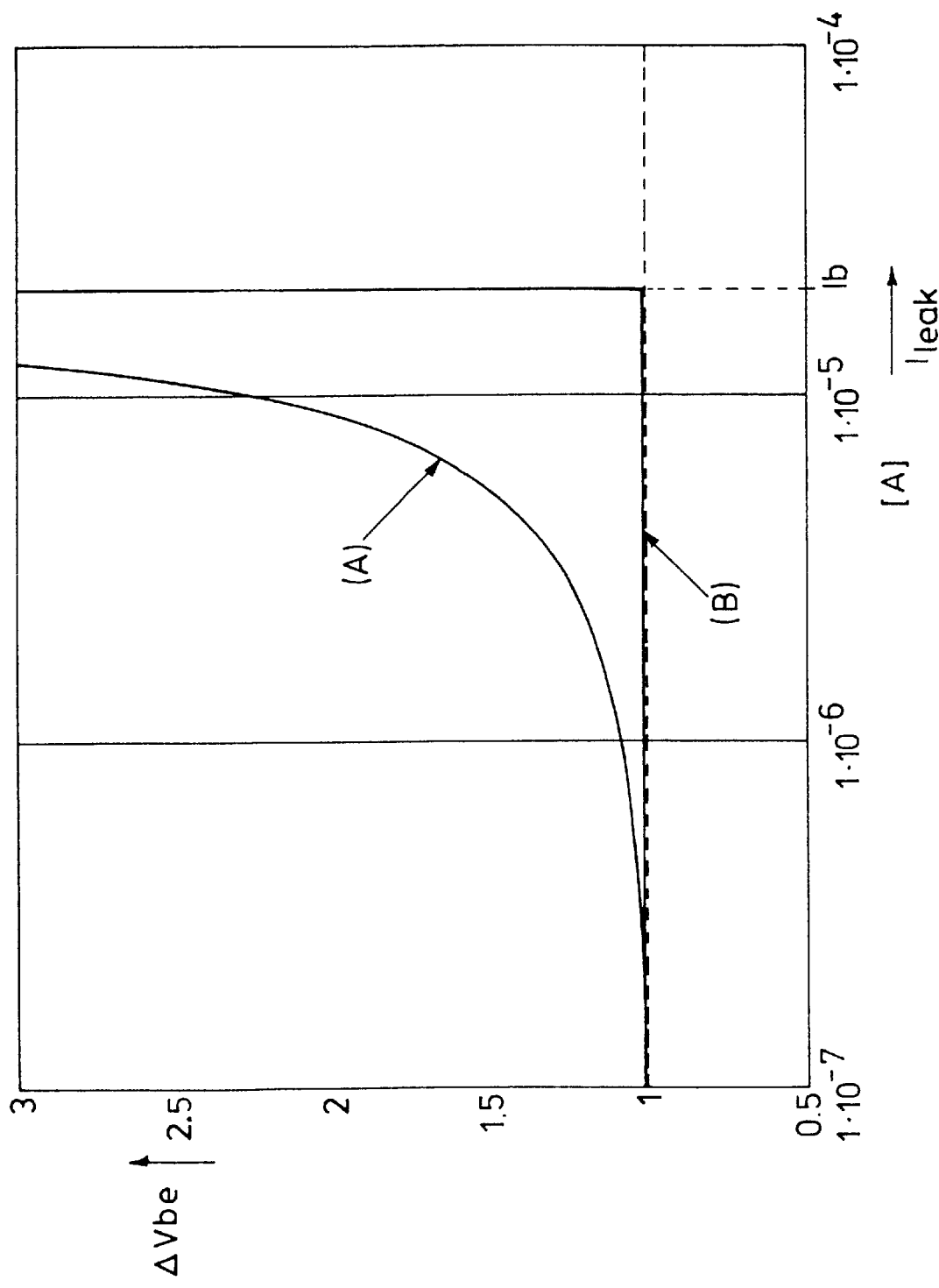
FIG. 3 is a graph of a voltage-current diagram, which represents a difference between the bipolar comparator (B) of the invention and the conventional bipolar comparator (A)

FIG. 3 shows in a voltage-current diagram, the variation of the offset voltage ΔVbe as a function of the leakage current $I_{leak}$. The curve designated by (A) here shows the signal variation of the known comparator configuration corresponding to FIG. 1 and the curve designated by (B) shows the signal variation with a circuit configuration according to the invention corresponding to FIG. 2. It is found that the offset ΔVbe is constant over wide ranges of the leakage current $I_{leak}$ with the comparator configuration according to the invention whereas the offset ΔVbe increases in undesirable manner with increasing leakage current $I_{leak}$ for a comparator circuit according to the prior art (see curve (A)).

If the leakage currents in the comparator configuration corresponding to FIG. 2 exceed the value of the operating current Ib, there will be a sudden increase in the offset voltage ΔVbe. The value of the operating current is specified by Ib=20 μA in FIG. 3. In a comparator circuit according to FIG. 2 (curve B), the offset voltage ΔVbe abruptly increases toward infinity with a leakage current $I_{leak} \geq Ib$ which is equal to an operating failure of the comparator configuration.

To avoid this, the comparator configuration can be statically adapted in such a manner that the comparator is made resistant against leakage currents in the area of the operating current Ib. This can be done, for example, by a discreet, that is to say incremental increase in the operating current that, however, requires very elaborate circuitry. Another more advantageous possibility will be described with reference to FIG. 4 in the text that follows.

Figure 4:
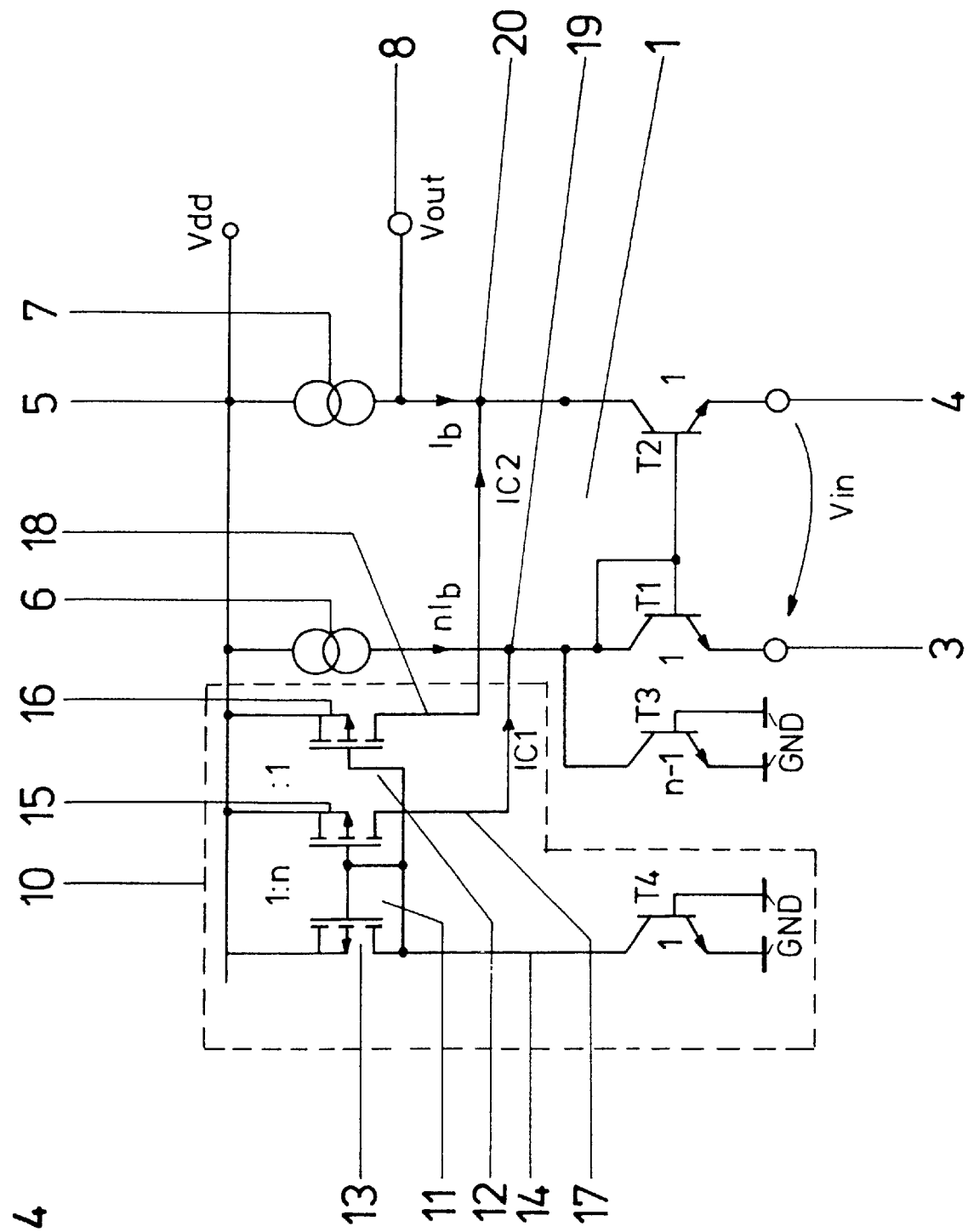
FIG. 4 is a circuit diagram of a second exemplary embodiment of the bipolar comparator according to the invention.

The comparator configuration according to FIG. 4 differs from the comparator configuration according to FIG. 2 by a correction circuit 10. The correction circuit 10 has two current balancing circuits 11, 12 with transmission ratios 1:n and 1:1, respectively. The current balancing circuits 11, 12 in each case have a common diode-connected transistor 13 in an input branch 14. The current balancing circuits 11, 12 also have two transistors 15, 16, which are disposed in parallel via their gate-source paths in two separate output branches 17, 18. In the input branch 14, which is disposed between the supply terminal 5 and the connection for the reference potential GND, a load current path of a fourth transistor T4 is disposed. The reference potential GND is applied to a base electrode of the fourth transistor T4.

The first output branch 17 with the first transistor 15 is connected to a node 19, which is disposed between the first current source 6 and the first transistor T1. The output branch 18 of the second current balancing circuit 12 is connected to a node 20 situated between the second current source 7 and the second transistor T2. The correction circuit 10 measures a respective leakage current via the fourth transistor T4 constructed as a measuring transistor and in each case generates a correction current IC1, IC2 which is supplied to the respective branches of the differential amplifier stage 1 via the two output branches 17, 18. This ensures that the manner of functioning and the operation of the comparator configuration is ensured even with leakage currents which are higher than the operating currents Ib, that is to say that the offset ΔVbe is constant even with high leakage currents. It is thus possible to increase the operating currents Ib, nIb dynamically via the correction circuit 10 as a result of which the static current consumption can be kept as low as possible.

Figure 5:
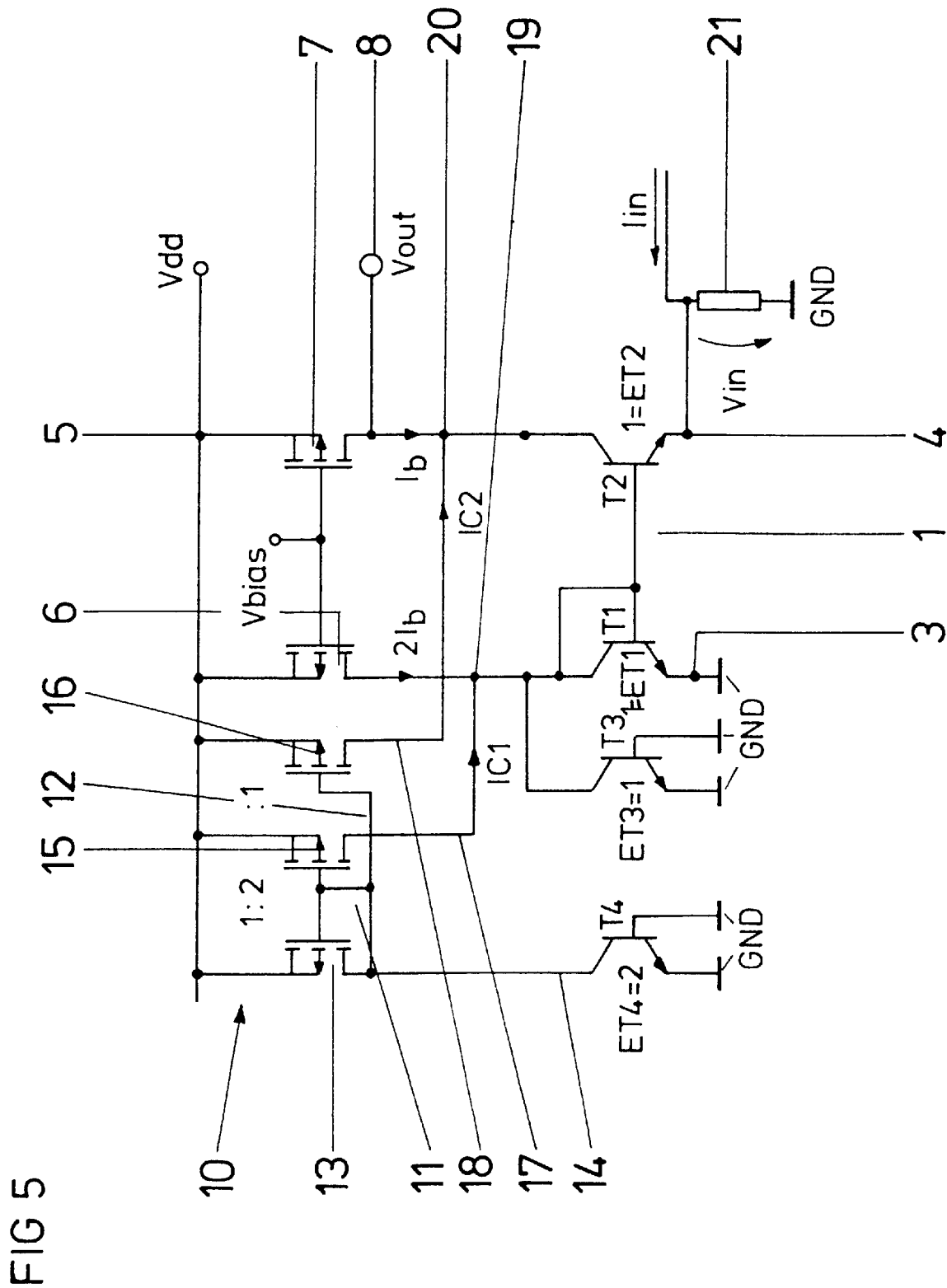
FIG. 5 is a circuit diagram of a third exemplary embodiment of the bipolar comparator according to the invention.

FIG. 5 shows a detailed exemplary embodiment of the comparator configuration according to FIG. 4. In FIG. 5, the transistors T1, T2, T3 in each case have a normalized collector area ET1=ET2=ET3=1. The current sources 6, 7 are constructed here as MOSFETs. A bias potential Vbias can be applied to gate electrodes of the MOSFETs 6, 7 which are short circuited to one another. The current sources 6, 7 constructed as MOSFETs are configured in such a manner that the first MOSFET 6 supplies twice the operating current Ib of the second MOSFET 7. In FIG. 5, an input current Iin, and thus a voltage drop Vin across a shunt resistor 21, is used as an input signal which is to be compared with the offset voltage ΔVbe of the comparator and is coupled into the second input terminal 4 of the differential amplifier stage 1 for this purpose. The potential of the reference ground GND is applied to the first input terminal 3 in FIG. 5.

FIG. 5 shows an exemplary embodiment in BCT technology in which the principle of the dynamic increase in the operating current by the correction circuit 10 is shown. The measuring transistor T4 is only used as a sensor for increasing the bias current in this case and does not need to be adapted to the respective transistors T1, T2, T3 with respect to the collector area ratios. In the exemplary embodiment according to FIG. 5, however, the measuring transistor T4 has twice the normalized collector area ET4=2 compared with transistors T1, T2, T3. The larger collector area ET4 of the measuring transistor T4 ensures that its collector leakage current will always be greater than the corresponding collector leakage current of transistors T1, T2, T3.

Figure 6:
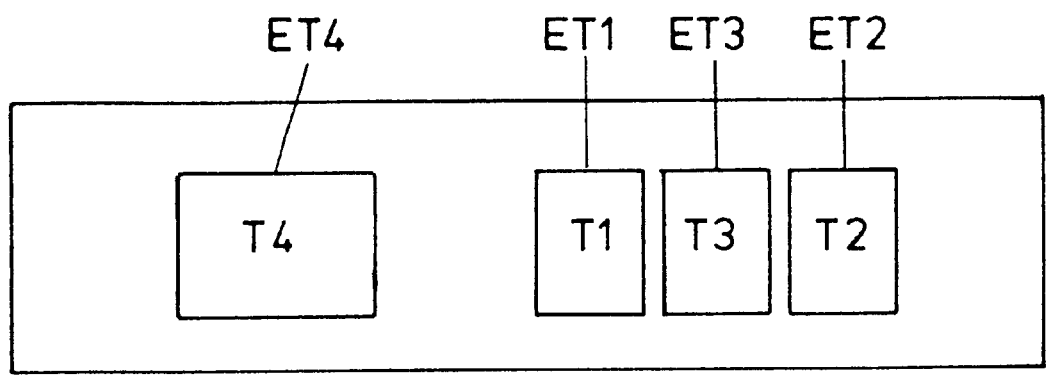
FIG. 6 is a block diagram of an advantageous layout of transistors T1 to T4 from FIG. 5.

FIG. 6 shows in a greatly simplified layout, an advantageous exemplary embodiment of the transistors T1 to T4 for n=2 according to FIG. 5, i.e. for an offset ΔVbe~18 mV (room temperature). The transistors T1 to T4 have an essentially rectangular layout in this case disposed in a semiconductor body 100. The second transistor T2 is advantageously disposed exactly between transistor T1 and T3 which leads to a particularly good match due to the coincidence of the corresponding center points of T1+T3 and T2. The fourth transistor T4 can be disposed in a more or less arbitrary manner. As in the present example, it is advantageous if the transistor T4 has a greater area ET4 than the remaining transistors T1 to T3.

The invention is not exclusively restricted to the exemplary embodiments of FIGS. 2, 4 and 5. Instead, a multiplicity of new circuit variants can be specified there, for example by exchanging the conductivity types n for p.

In summary, it can be noted that, due to the insertion of an additional dummy transistor and a suitable choice of the collector area ratios, a comparator configuration with defined offset can also be specified for high leakage currents or increasing temperature in a simple but nevertheless very effective manner.

The present invention has been explained by the present description in such a manner in order to explain the principle of the invention and its practical application in the best possible way. Naturally, the present invention can be implemented in a suitable manner in many different embodiments and versions within the context of expert action and knowledge.

I claim:

1. A bipolar comparator with an asymmetric differential amplifier stage, comprising:

current sources including a first current source and a second current source each having an output;

input terminals including a first input terminal for receiving a first input potential and a second input terminal for receiving a second input potential;

transistors, including a first transistor and a second transistor each having a control electrode short circuited to one another, a load electrode, and a load path, said load path of said first transistor disposed in series between said first current source and said first input terminal, said load path of said second transistor disposed in series between said second current source and said second input terminal;

a supply terminal for receiving a supply potential and connected to said current sources;

an output terminal connected between said second current source and said load electrode of said second transistor, an output signal being available for picked up at said output terminal; and a third transistor having a load path connected between said load electrode of said first transistor and ground, said first transistor connected as a diode resulting in a diode-connected first transistor;

said first current source generating a first operating current being a multiple of a second operating current generated by said second current source and the multiple corresponds to an effective area ratio of said first and said third transistor with respect to said second transistor.

2. The comparator according to claim 1, wherein the effective area ratio is equal to a sum of effective collector areas of said first and said third transistor divided by an effective collector area of said second transistor.

3. The comparator according to claim 2, including a correction circuit having a first output connected to said output of said first current source and a second output connected to said output of said second current source and, in a case where a leakage current at one of said first and said second transistor exceeds the first operating current or the second operating current, respectively, said correction circuit dynamically superimposes a correction current on one of the first and the second operating current in such a manner that a resultant current is greater than the leakage current.

4. The comparator according to claim 3, wherein said correction circuit has two current balancing circuits including a first current balancing circuit and a second current balancing circuit, said two current balancing circuits having a common input branch and in each case one output branch, a transmission ratio of said first current balancing circuit being inversely proportional to the effective collector area of said first and of said third transistor, and a transmission ratio of said second current balancing circuit being inversely proportional to the effective collector area of said second transistor.

5. The comparator according to claim 4, wherein said correction circuit has a measuring transistor with a load current path disposed in said common input branch of said two current balancing circuits.

6. The comparator according to claim 5, wherein said measuring transistor has an effective collector area that is greater than at least one of the effective collector area of said first transistor, the effective collector area of said second transistor, and the effective collector area of said third transistor.

7. The comparator according to claim 1, wherein at least one of said current sources is constructed from a transistor, including MOSFETs.

8. The comparator according to claim 1, wherein at least one of said current sources is constructed as a resistor.

9. The comparator according to claim 1, including a shunt resistor connected to said second input terminal and across which an input voltage can be picked off.

10. The comparator according to claim 1, including a semiconductor body, and at least one of said first transistor, said second transistor, and said third transistor is integrated in said semiconductor body, each of said first, said second and said third transistor is formed of three individual transistors having load current paths connected in parallel with each other.

11. The comparator according to claim 10, wherein:

said three individual transistors include a first individual transistor, a second individual transistor and a third individual transistor;

said first and said third individual transistor of said first and said third transistor and said second individual transistor of said second transistor are disposed in such a manner that a center point resulting from said first and said third individual transistor is equal to a center point of said second individual transistor in a layout of said semiconductor body.

12. The comparator according to claim 1, wherein the multiple is two.

* * * * *